United States Patent

Dykeman et al.

[11] 4,153,528
[45] May 8, 1979

[54] CONTOURED QUARTZ ANODE PLATE

[75] Inventors: Robert H. Dykeman; Man-Chong Wong, both of Poughkeepsie, N.Y.

[73] Assignee: International Business Machines Corporation, Armonk, N.Y.

[21] Appl. No.: 919,337

[22] Filed: Jun. 26, 1978

[51] Int. Cl.² ............................................. C23C 15/00
[52] U.S. Cl. ........................... 204/192 R; 204/192 D; 204/298
[58] Field of Search ........... 204/192 R, 192 C, 192 D, 204/298, 192 EC

[56] References Cited
U.S. PATENT DOCUMENTS 3,661,761  5/1972  Koenig ................................. 204/298

FOREIGN PATENT DOCUMENTS 1765144  1/1972  Fed. Rep. of Germany ...... 204/192 D

OTHER PUBLICATIONS

H. M. Gartner et al., "Compensation Mechanism for Uniform Sputtering", *IBM Tech. Disc. Bull.*, vol. 19, pp. 516–517 (1976).
S. S. Scianna, "Improving Uniformity of Sputtered Quartz", *IBM Tech. Disc. Bull.*, vol. 13, p. 1448 (1970).

*Primary Examiner*—Aaron Weisstuch
*Attorney, Agent, or Firm*—David M. Bunnell

[57] ABSTRACT

Sputter deposited coating uniformity is improved by contouring the anode plate to provide thinner regions around the wafer edges so that more resputtered coating material is deposited at the wafer edge to compensate for the observed decrease in coating thickness at the edge.

8 Claims, 12 Drawing Figures

CONTOURED QUARTZ ANODE PLATE

BACKGROUND OF THE INVENTION

This invention relates to sputtering processes and more particularly to an anode plate configuration in an RF sputter deposition system for achieving more uniform dielectric film deposition on substrates.

In the formation of thin passivating layers on substrates by RF cathode sputtering, such as forming quartz layers onto semiconductor wafers placed on an anode, problems of layer uniformity occur depending upon the location of the wafers on the anode. It is found that the thickness of the layers tends to drop off at the edges of the wafers. This problem is more severe with the wafers which are located around the outer portions of the anode, especially along the outer edges of the wafers which have no wafers adjacent to them. This non-uniformity causes difficulties in integrated circuit manufacture because the layer thickness of the edges may be insufficient to provide the needed passivation on chip sites located close to the edge of the wafer. The non-uniformity across the wafer also can result in processing difficulties where the chips at the edge would reach etch completion before those at the center.

Ways of achieving better coating uniformity have been proposed, for example, the article "Compensation Mechanism for Uniform Sputtering" by H. M. Gartner et al., IBM Technical Disclosure Bulletin, Vol. 19, No. 2, pps 516-517, July 1976, in which the distances between the wafers and the cathode are varied depending upon the wafer location by the use of spacers, pedestals or grooves of different thickness. The closer the wafer to the cathode, then the thicker the coating.

We have now found that, in order to maintain the uniformity of coating quality, the surfaces of the wafers should be located in the same plane. Also, the thickness of the anode plate under each wafer should be uniform to maintain each wafer at the same potential to improve uniformity. Furthermore, it has been found that the edge drop off problem is primarily related to the resputtering condition at the anode rather than the amount of incident material from the cathode. A lower anode potential along edges of the outermost wafers is believed to cause less resputtered material to be deposited in those areas than elsewhere, then causing the observed thickness drop off.

BRIEF SUMMARY OF THE INVENTION

In accordance with this invention there is provided an improved radio frequency sputter deposition system and process for coating a plurality of work pieces with a layer of material. The system includes a low pressure ionization chamber containing an anode plate for supporting the workpieces in a common plane and a cathode source of coating material. A source of radio frequency power is provided for producing a glow discharge in a gas in the chamber. The improvement comprises contouring the anode plate so as to provide a thinner region at the edge of a workpiece, while maintaining the thickness of the anode plate under the workpieces substantially constant so as to provide a more uniform coating layer of material on the workpiece.

DETAILED DESCRIPTION

Figure 1:
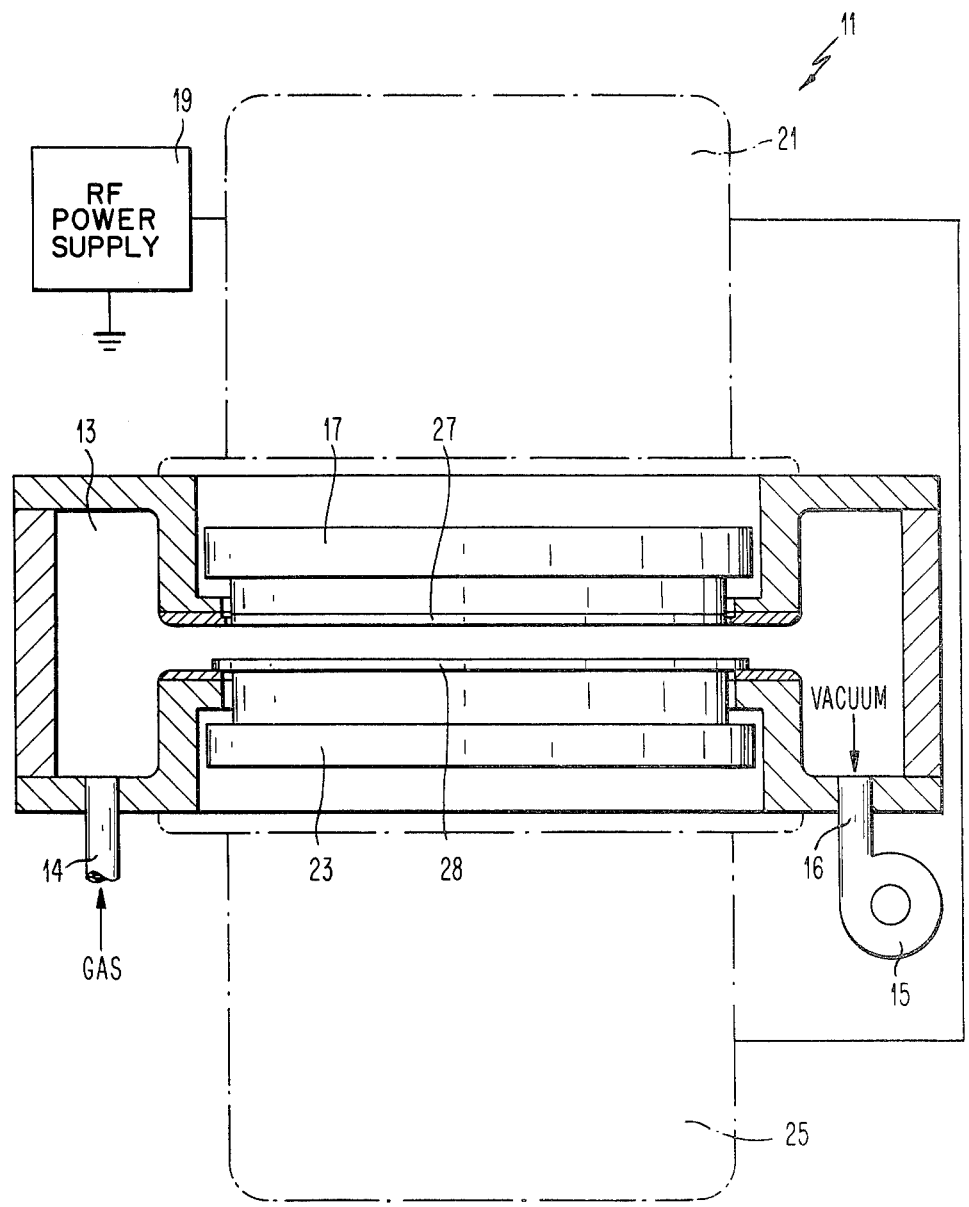
FIG. 1 is a schematic diagram partly in section of a sputtering apparatus.
Figure 2A:
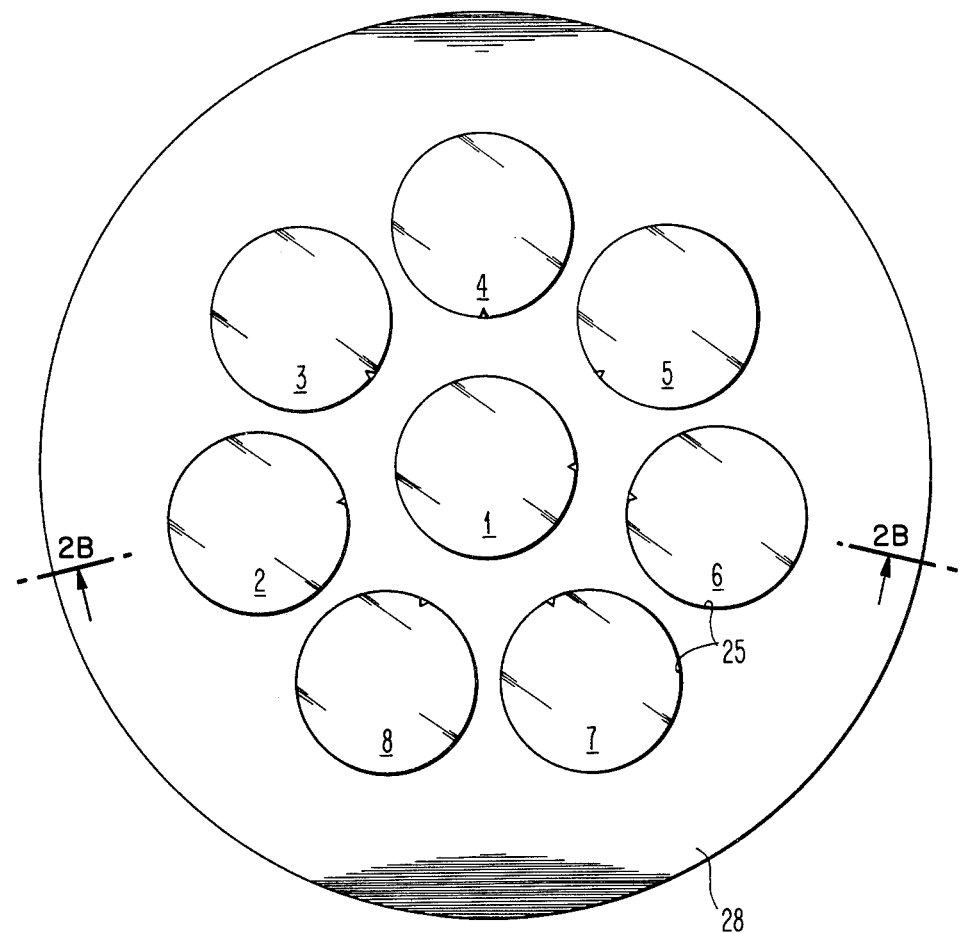
FIG. 2A is a plan view of a conventional anode plate with pockets for retaining wafers.
Figure 2B:
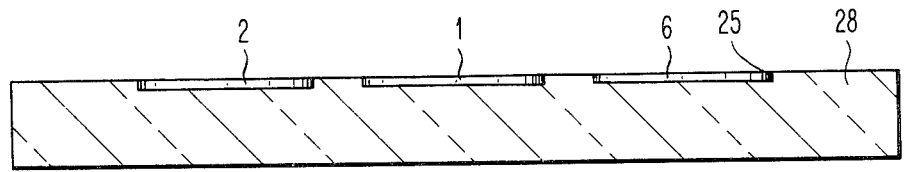
FIG. 2B is a cross-sectional view of the plate of FIG. 2A.

FIG. 1 illustrates a driven anode RF sputtering apparatus 11. The apparatus includes a chamber 13 and vacuum pump 15 which permits the evacuation of chamber 13 through conduit 16 to maintain at a desired pressure a suitable ionizable gas such as argon or neon supplied through conduit 14 into chamber 13. The pressure is maintained in the order of 2 to $25 \times 10^{-3}$ Torr. The target electrode or cathode 17 is supplied with RF power from supply 19 through cathode matchbox 21 as is conventional in the art. In the illustrated system, power is tapped from matchbox 21 and fed to anode 23 through anode matchbox 25. A layer 27 of material to be sputtered, such as quartz or silicon nitride, is placed on the surface of the cathode 17. The workpieces to be sputter coated are placed at the anode 23. As shown in FIG. 2A and 2B silicon semiconductor wafers 1-8 are conventionally placed in locating pockets 25 of a quartz plate 28 at anode 23.

In operation, with a system having a 28 inch diameter chamber enclosing both a cathode and anode each having a 17 inch diameter, a cathode to anode distance of one inch, RF power of 4.5 KW supplied to the cathode matchbox and with the anode voltage set at about 400V, peak to peak, a deposition rate of sputtered quartz of about 180 Å min. is achieved. The quartz plate carrying the wafers has a thickness of about 125 mils with recessed pockets about 18 mils deep to keep the wafers in place.

Figure 3:
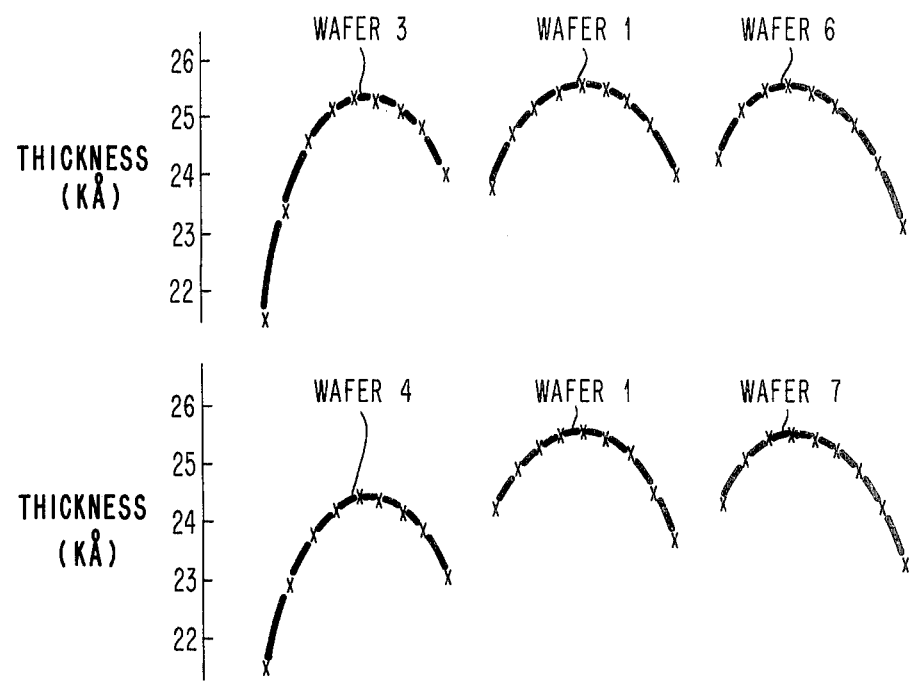
FIG. 3 are graphs of sputtered layer thickness profiles obtained using the conventional plate of FIGS. 2A and 2B.

FIG. 3 illustrates the thickness profiles of deposited quartz layers obtained with a film thickness analyzer at points along the radial and tangential diagonals of the wafer, spanning to about a quarter of an inch from the edge of each wafer.

FIG. 3 shows the approximate profile across the anode by plotting the radial profiles of the two outside wafers and one of the orthogonal diagonals of the center wafer, which is closer aligned with the radial profiles. Large drop-offs are evident at the outside edge of the peripheral outside wafers. The thickness variation ($\Delta X$) across the individual wafer, as a measure of the drop-off, is defined as the thickness spread between the high and the low readings, relative to the average of the total readings. The variations for the conventional plate range from 8% to 15% for the different wafer positions, as shown in Table I below.

Figure 4A:
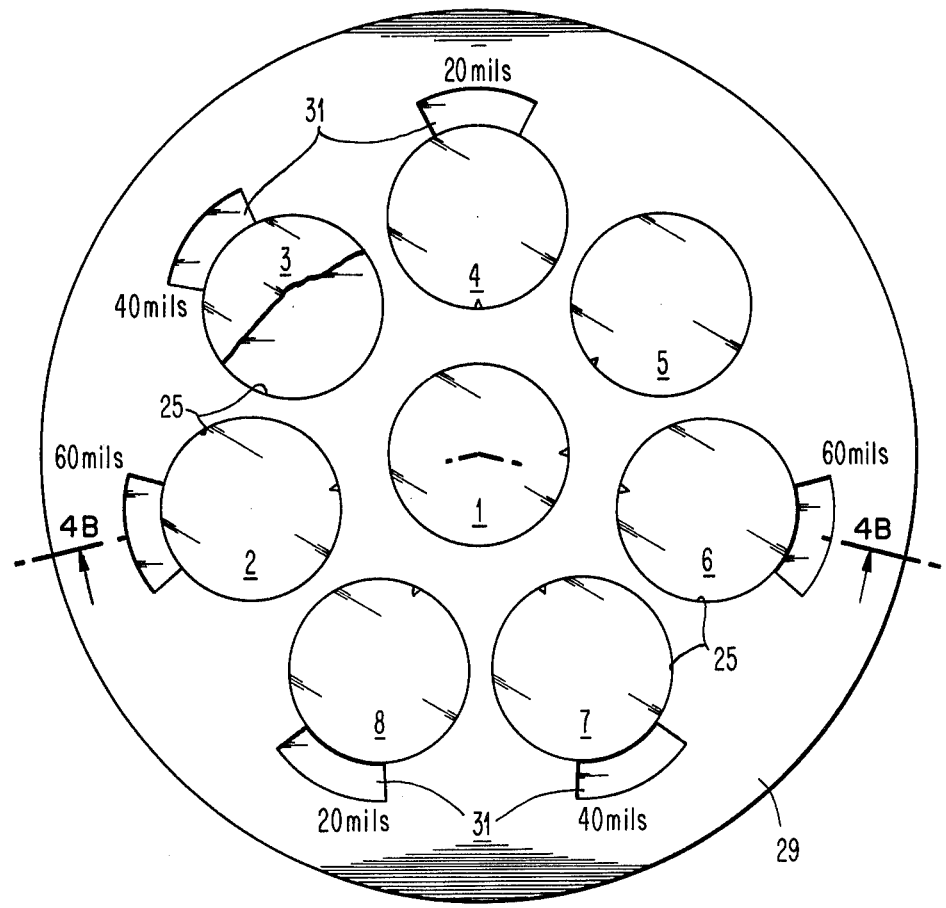
FIG. 4A is a plan view of an embodiment of a contoured anode plate.
Figure 4B:
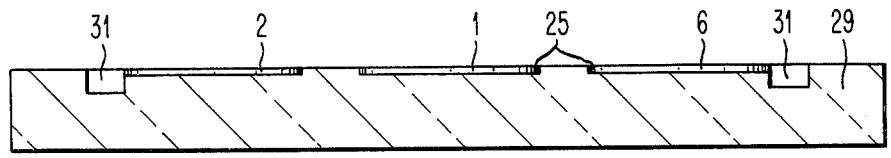
FIG. 4B is a cross-sectional view of the plate of FIG. 4A.

FIGS. 4A and 4B show the top section views of an embodiment of a contoured anode plate 29 of the invention. This plate 29 has, in addition to the conventional wafer pockets 25, also "cutouts" 31 or indentations adjacent to pockets 25. The cutouts can be of various shape and dimensions depending on the wafer positions, giving rise to the term "contoured" anode plate. The cutouts can have either straight or tapered sidewalls and can be extended to the edge of the plate.

Figure 5:
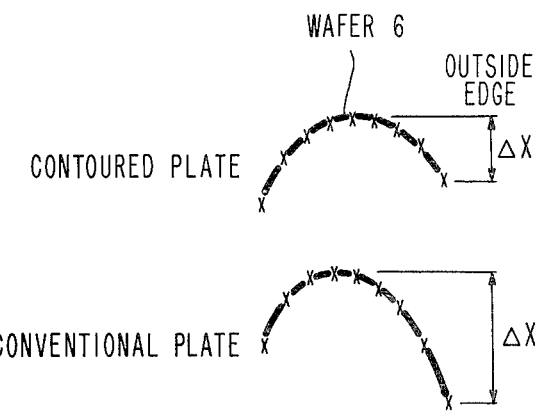
FIG. 5 are graphs of sputtered layer thickness profiles comparing a conventional plate and a contoured plate.

The cutouts 31 are of a fan shape, subtending an arc of about 60 degrees and having a width of about half an inch. The depths are 20-60 mils, as shown. The effects of these small cutouts were observed to reduce the thickness drop-off, as shown in FIG. 5 and Table I. The thickness variations $\Delta X$ were reduced by about 40%. Larger reductions, or smaller resultant $\Delta X$, were evident for deeper cutouts.

Table I

| Wafer | Conventional Plate $\Delta X$ | Contoured Plate $\Delta X$ |
|---|---|---|
| 2 | 15.1% | 7.7% |
| 3 | 11.9 | 8.1 |
| 4 | 11.7 | 6.8 |
| 6 | 8.0 | 4.5 |
| 7 | 9.7 | 5.4 |
| 8 | 8.2 | 6.3 |

Figure 6A:
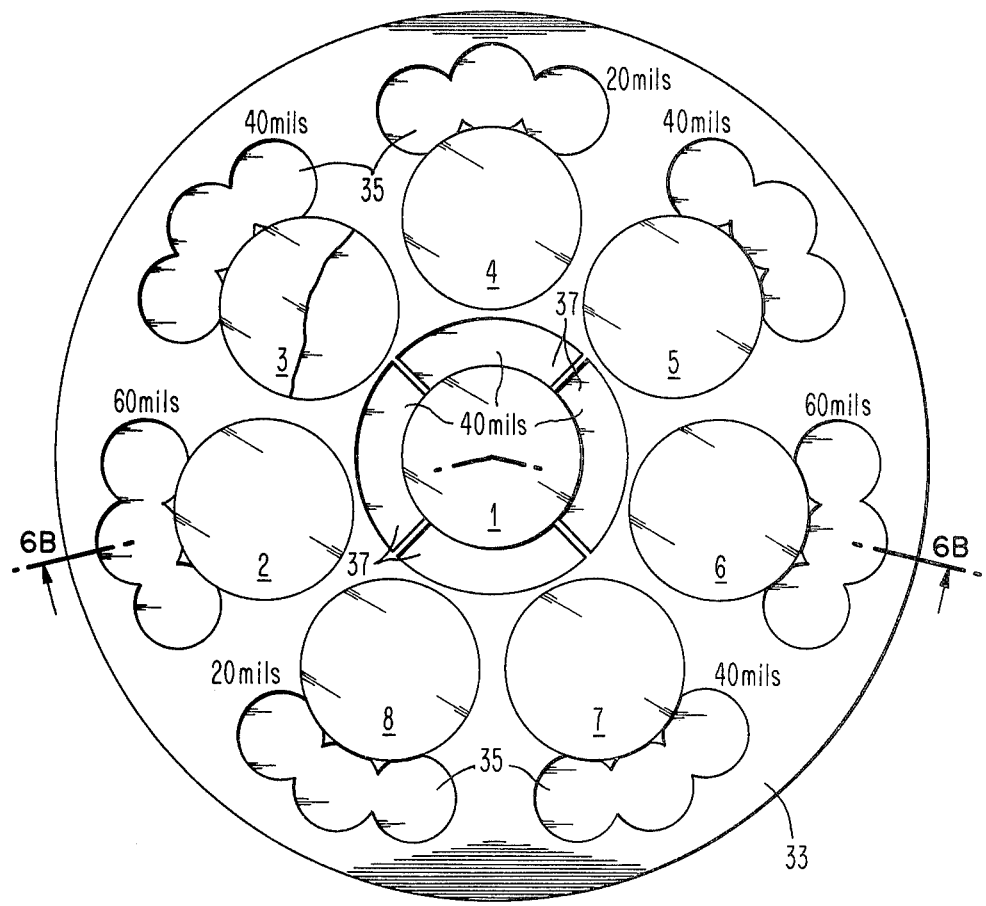
FIG. 6A is a plan view of another embodiment of a contoured anode plate.
Figure 6B:
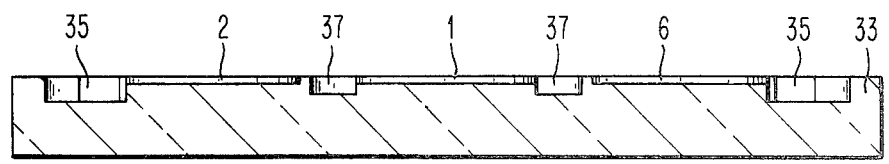
FIG. 6B is a cross-sectional view of the plate of FIG. 6A.
Figure 7:
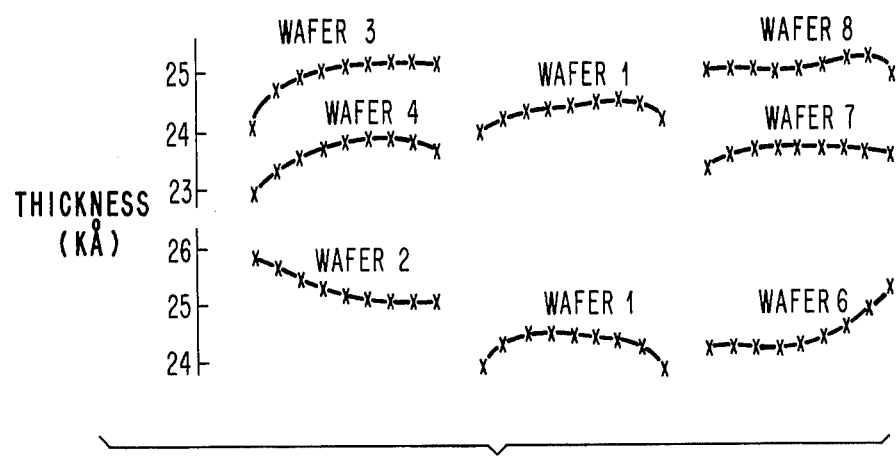
FIG. 7 are graphs of sputtered layer thickness profiles obtained using the plate of FIGS. 6A and 6B.

FIGS. 6A and 6B show a contoured quartz plate 33 with larger cutouts 35. The effects were found to be more enhanced and dramatic, as shown in FIG. 7. These cutouts 35 are wider than those of the embodiment of FIGS. 4A and 4B, and are composed of overlapped circles of 1.25 in. diameter. Their depths are again 20-60 mils as shown in FIG. 6A. The circular pattern was arbitrarily chosen for expediency and ease of fabrication. Cutouts 37 with a fan shape 40 mils deep and 0.5 inch wide surround wafer position 1 to permit observation of the effect on coating uniformity toward the middle of the anode plate 33 as well as at the outer portions.

The results obtained using the plate 33 of FIGS. 6A and 6B clearly illustrate drastic reductions in the thickness dropoff at the edge of the wafer which are obtained using a contoured anode plate. For instance, the ordinary 11% drop-off for some wafers (positions 3 and 4) was reduced to about 4%; and with other wafers (7 and 8) the thickness variations were reduced to about 1%. A summary of the results is presented in Table II.

Table II

| | Thickness Variations ($\Delta X$) | |
|---|---|---|
| Wafer # | Conventional Plate | Contoured Plate |
| 1 | 6.9% | 2.7% |
| 2 | 15.1 | *3.3 |
| 3 | 11.9 | 4.3 |
| 4 | 11.7 | 4.2 |
| 5 | 8.1 | 3.8 |
| 6 | 8.5 | *4.5 |
| 7 | 9.3 | 0.4 |
| 8 | 7.7 | 0.9 |

*Curl-up

Actually, it was found that the drop-off could be over-compensated (curl-up), for example, at wafer positions #2 and #6 the cutouts were deeper than required. Therefore the area and depth of the cut-outs should be tailored or "contoured" according to the amount of observed edge effect to be corrected.

If the cut-out is found to be too large in terms of depth or width, it is possible to effectively reduce the dimension by placing thin glass shims inside the cut-out or by partially covering the cut-out with a microscope slide. This will revert the curl-up to the drop-off normally observed. When the deep cut-outs at wafer positions #2 and #6 were partially covered by glass slides, the profile curl-up was eliminated. Similar results were obtainable if the deep cut-outs were partially filled with thin glass shims.

The contoured anode plate is also applicable to "standard" quartz deposition (at lower resputtering level than "planar" quartz) in a tuned-anode sputtering system. Significant improvements in uniformity were obtained.

Figure 9:
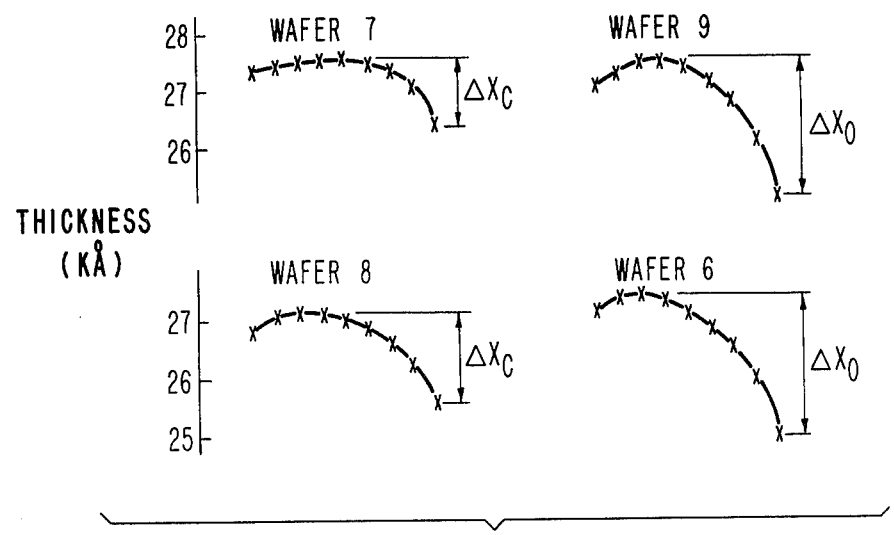
FIG. 9 are graphs of sputtered layer thickness profiles obtained using the plate of FIG. 8.
Figure 8:
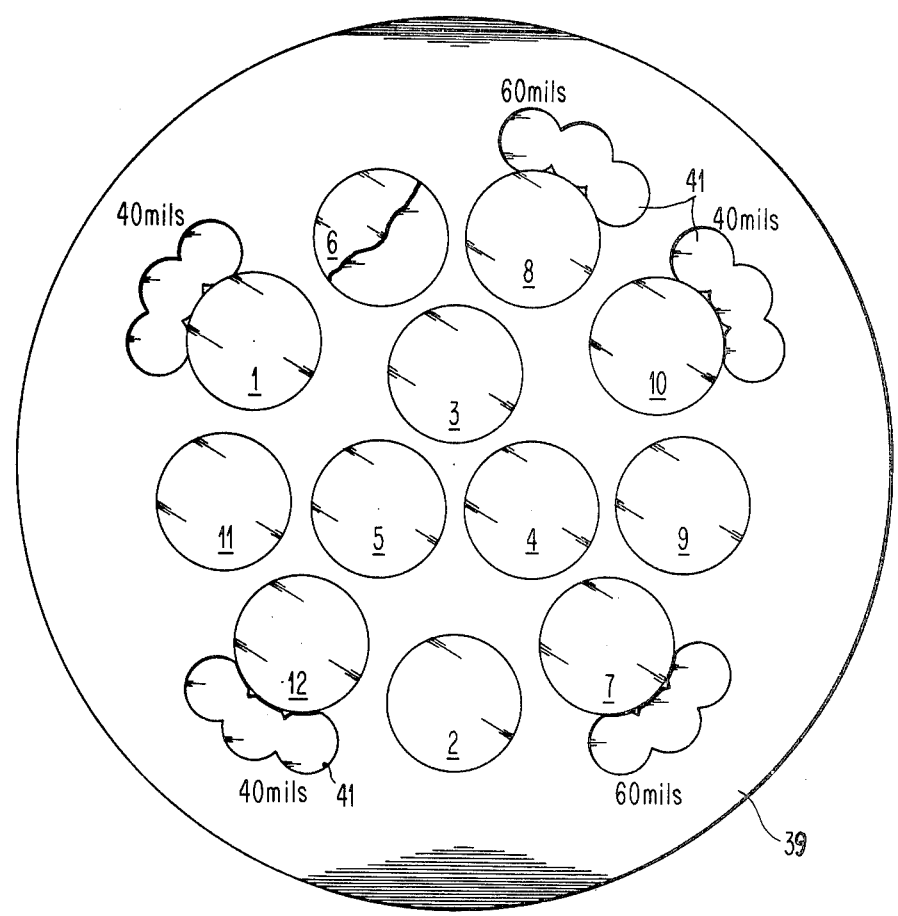
FIG. 8 is a plan view of another embodiment of a contoured anode plate.

The results obtained with the tuned anode system are shown in FIGS. 8 and 9. The anode wafer plate 39 used for the system was a quartz plate of about 230 mils thick with 3¼ in. wafer pockets 14 mils deep. The cut-outs 41 provided at selected positions were 45 and 60 mils deep. Thickness profiles for adjacent wafer positions, one with and the other without cut-outs, are compared in FIG. 9. It can be seen that wafer positions 7 and 8, those with cut-outs, definitely exhibit smaller thickness variations than positions 6 and 9. For this quartz plate and system apparently deeper cut-outs are warranted for further reductions in thickness variations.

The cut-outs basically act to restore the quartz film at the wafer edge to the same quality and condition as the film at the center. The quartz coating shape and profile of a wafer coated using the contoured plate, after etch in buffered HF remain unchanged, indicating the quartz has the same etch rate and quality for both the center and the edge regions.

The effect of the cut-outs is believed to increase the resputtering potential at the wafer edge by making the quartz dielectric plate thinner at these regions so that the wafer edges will receive about the same amount of resputtered material as the center rather than less as in the case of the conventional plate. It has also been observed that small variations in the depth of the wafer holding pockets can be made to eliminate any potential difference between wafers due to plate thickness variations under the wafers and thereby additionally improve uniformity.

The foregoing has described a method of improving sputter deposited coating quality and uniformity of a group of workpieces. The contoured anode plate is applicable to both driven-anode and tuned-anode sputtering systems. Improvements in thickness uniformity are observed in both planar and standard quartz depositions of high and low resputtering, respectively.

Having thus described my invention, what I claim as new, and desire to secure my Letters Patent is:

1. In a sputter deposition system for coating workpieces with a layer of material, said system including, a low pressure ionization chamber containing an anode plate having recesses in its upper surface for supporting workpieces in a common plane, a cathode source of coating material, and a source of power for producing a glow discharge in a gas contained in said chamber, the improvement which comprises: A contoured anode plate which provides a thinner region of said plate at the edge of at least one recess and a substantially uniform but greater thickness directly under the workpieces so as to provide a more uniform coating layer of material on the workpieces.

2. The system of claim 1 wherein the power source is a radio frequency power source.

3. The system of claim 1 wherein the system is a driven anode system.

4. The system of claim 1 wherein the system is a tuned anode system.

5. The system of claim 1 wherein the thinner region is formed by cutouts in the anode plate along portions of the edges of the recesses which are located at the outer portion of the anode plate where there is no adjacent recess.

6. The system of claim 1 wherein the thickness of the anode under the workpieces is adjustable to provide an equal potential on each workpiece.

7. In a process for sputter coating workpieces with a layer of material in which the workpieces are supported in a common plane within recesses formed in an anode plate in a low pressure atmosphere of an ionizable gas and power is supplied to a cathode source of coating material to produce a glow discharge in said gas so that material is sputtered from the source onto the workpieces, the improvement which comprises providing the anode plate with a thinner region at the edge of at least one said recess while maintaining the thickness of the anode plate directly under said work pieces substantially constant and greater than said thinner region so as to provide a more uniform coating layer of material on the workpieces.

8. The process of claim 7 wherein the workpieces are semiconductor wafers and the thinner region is formed by a cutout located along a portion of the edge of at least one said recess which is located at the outer portion of the anode plate, which portion of the edge is not adjacent to another wafer.

* * * * *